United States Patent
Nishikawa

(10) Patent No.: US 6,496,042 B1
(45) Date of Patent: Dec. 17, 2002

(54) PHASE COMPARATOR FOR IDENTIFYING AND RETURNING A NON-RETURN-TO-ZERO RECEIVING SIGNAL

(75) Inventor: Satoshi Nishikawa, Tokyo (JP)

(73) Assignee: Oki Electric Industry, Co., Ltd., Tokyo (JP)

( * ) Notice: Subject to any disclaimer, the term of this patent is extended or adjusted under 35 U.S.C. 154(b) by 0 days.

(21) Appl. No.: 09/695,860

(22) Filed: Oct. 26, 2000

(30) Foreign Application Priority Data

May 26, 2000 (JP) ........................................ 2000-155672

(51) Int. Cl.[7] ................................................. H03D 3/00
(52) U.S. Cl. ................................ 327/2; 327/7; 327/12; 327/156; 331/17
(58) Field of Search .............................. 327/2, 7, 9, 10, 327/12, 156, 157; 331/17, 25, 1 A

(56) References Cited

U.S. PATENT DOCUMENTS 5,455,540 A * 10/1995 Williams ...................... 327/12
5,602,512 A * 2/1997 Neron ........................... 327/12
5,963,099 A * 10/1999 Nagoya et al. ............. 327/157

OTHER PUBLICATIONS

Kaenel et al., "A 320 MHz, 1.5 mW @ 1.35 V CMOS PPL for Microprocessor Clock Generation", IEEE J. Solid–State Circuits., 31(11), pp. 1715–1722 (Nov. 1996).

Dan H. Wolaver; "Phase–Locked Loop Circuit Design"; 1991; Publisher: PTR Prentice Hall, Inc. –A Paramount Communications Company.

* cited by examiner

Primary Examiner—Terry D. Callahan
Assistant Examiner—An T. Luu
(74) Attorney, Agent, or Firm—Venable, Baetjer, Howard & Civiletti, LLP; James R. Burdett

(57) ABSTRACT

A phase comparator which eliminates jitter in a clock signal extracted in a phase locked loop. The phase comparator includes: a flip-flop circuit which inputs input data and the clock signal and stores the input data in response to the clock signal; a delay circuit which inputs the input data and delays the input data by a predetermined angle of 0° through 180°; a first logic gate which inputs the input data and an output signal of the flip-flop circuit and which outputs an output signal by taking an exclusive OR or exclusive NOR thereof; and a second logic gate which inputs the data and the output signal of the delay circuit and which outputs an output signal by taking an exclusive OR or exclusive NOR thereof.

27 Claims, 8 Drawing Sheets

PRIOR ART

FIG.6A  t1 t2 t3 t4 t5 t6 t7 t8 t9 t10

PHASE COMPARATOR FOR IDENTIFYING AND RETURNING A NON-RETURN-TO-ZERO RECEIVING SIGNAL

BACKGROUND OF THE INVENTION

1. Field of the Invention

The present invention relates to a phase comparator provided in a phase locked loop (referred to as a PLL hereinafter) used for extracting a clock signal that identifies and regenerates a non-return-to-zero (NRZ) receiving signal in a receiving circuit for use in transmitting a digital signal.

2. Description of the Related Art

The following literature are available which describe the conventional techniques relating to the above field.

Publication (1): Dan H. Wolaver, "Phase-Locked Loop Circuit Design", 1991, PTR Prentice Hall, Prentice Hall, Inc., A Paramount Communications Company, Englewood Cliffs, N.J. 07632, P. 222

Publication (2): Vincent von Kaenel, Daniel Aebischer, Christian Piguet and Evert Dijkstra, "A 320 MHz, 1.5 mW @ 1.35 V CMOS PLL for Microprocessor Clock Generation", IEEE JOURNAL OF SOLID-STATE CIRCUITS, 31 [11] (US), 1996, PP. 1715–1722

FIG. 1 shows a structure of a general PLL circuit.

This PLL circuit includes a phase comparator 10 which detects a phase difference between data Si having a phase of $\theta i(t)$ and an output signal So having a phase of $\theta o(t)$, and which generates an output voltage Vp proportional to the detected phase difference. A loop filter 30 is connected to an output terminal of the phase comparator 10, and an output terminal of the loop filter 30 is connected to a voltage controlled oscillator (referred to as VCO hereinafter) 32. The loop filter 30 is a circuit which smoothes out the output voltage Vp and extracts a control voltage Vc proportional to the phase difference. The loop filter includes, for example, a low-pass filter having a resistor R and capacitor C. The VCO 32 is a circuit in which the oscillation frequency is controlled by the control voltage Vc output from the loop filter 30 so as to output the output signal So having the phase of $\theta o$. This output signal So is fed back to the phase comparator 10.

In the PLL circuit, the response mode and the response speed are determined by a characteristic of the loop filter 30. In the closed-loop operation of the PLL circuit, in order to seek a stable state (locked state) such that the difference between the phase $\theta i(t)$ of the input data Si and the phase $\theta o(t)$ of the output signal So becomes constant (that is, $\theta i(t)-\theta o(t)=$constant), the phase $\theta o(t)$ of the output signal So automatically approaches that of the output signal Si. If there is no input data Si, the control voltage Vc output from the loop filter 30 is 0, so that the VCO 32 oscillates at a free running frequency fo. When the data Si having the frequency fi is inputted, the phases of the frequency fi and the frequency fo are compared by the phase comparator 10. Then, the output voltage Vp corresponding to the phase difference is inputted to the loop-filter 30 and applied to a control terminal of the VCO 32, so that the phase difference is controlled so as to be a constant value. When the oscillating frequency fo of the VCO is sufficiently close to the frequency fi of the data Si, the frequency fo will be locked to the frequency fi, so that the phase difference becomes constant and there will be no frequency difference.

FIG. 2 is a circuit diagram of the phase comparator described in the publication (1) and shown in FIG. 1.

The comparator includes an input terminal 11 which inputs data Si, and an input terminal 12 which inputs the output signal So from the VCO 32. An inverter 13 which inverts the output signal So is connected to the input terminal 12. Delayed flip-flop circuits (referred to as D-FF hereinbelow) 14 and 15 are connected to the input terminal 11 and the inverter 13, respectively. 2-input exclusive OR gates (referred to as EXOR hereinafter) 16 and 17 are connected to the output sides of the D-FF 14 and 15, respectively.

The D-FF 14 includes a data input terminal D connected to input terminal 11, a clock input terminal CK connected to the input terminal 12, and an output terminal Q outputting the data. The D-FF 14 is a circuit which detects the data Si inputted to the data input terminal D at a positive edge (rising edge) of the output signal So inputted from the clock input terminal CK and stores the inputted data Si. The output terminal Q of the D-FF 14 is connected to one of the input terminals of the EXOR gate 16. The D-FF 15 includes a data input terminal D connected to the output terminal Q of the D-FF 14, a clock input terminal CK which inputs an inverted signal obtained after the output signal So was inverted by the inverter 13, and an output terminal Q outputting the data. The D-FF 15 is a circuit which detects the output signal of the D-FF 14 at a positive edge of the inverted signal of the output signal So inputted to the clock input terminal CK and stores such the output signal of the D-FF 14. This output terminal Q of the D-FF 15 is connected to one of input terminals of the EXOR gate 17.

The EXOR gate 16 is a circuit which takes the EXOR of the data Si inputted to the two input terminals and the output signal of the D-FF 14, so as to output the output signal S18 from the output terminal 18. The EXOR gate 17 is a circuit which takes the EXOR of the output signal of the D-FF 14 inputted to the two input terminals and the output signal of the D-FF 15, so as to output the output signal S19 from the output terminal 19. The output terminals of the EXOR gates 16 and 17 are connected to the output terminals 18 and 19, respectively.

FIGS. 3A through 3C are timing charts showing the operation of the phase comparator shown in FIG. 2. FIG. 3A is a timing chart where the phase of the data Si matches that of the VCO output signal So. FIG. 3B is a timing chart where the phase of the VCO output signal So is delayed compared to that of the data Si. FIG. 3C is a timing chart where the phase of the VCO output signal So is ahead of that of the data Si. Next, the operation of the phase comparator shown in FIG. 2 will be described with reference to FIGS. 3A–3C.

For example, let us consider a case where the data Si repeat in a sequence of 0, 1, 0, 1, . . .

Referring to FIG. 3A where the phase of the data Si matches that of the VCO output signal So, the output terminals 18 and 19 are outputted by repeating the pulses of the same pulse width (output signals S18 and S19) alternately at the period of the VCO signal So.

Referring to FIG. 3B where the phase of the VCO output signal So is delayed compared to that of the data Si, the output terminal 18 generates a pulse (output signal S18) having a pulse width broader by the phase-delay amount.

Referring to FIG. 3C where the phase of the VCO output signal So is ahead of that of the data Si, the output terminal 18 generates a pulse (output signal S18) having a pulse width narrower by the amount by which the phase is ahead. Thus, the difference between the time average of the output signal S18 and the time average of the output signal S19 becomes a value proportional to the phase difference in the range of $-\pi$ to $+\pi$, so as to carry out the operation of the phase comparator.

Moreover, when the data Si are a sequence of 0, 0, 0, . . . or 1, 1, 1, . . . , the output signals S18 and S19 become 0. Thus, in the case where the data Si having the same repeated values are inputted in a continuous manner as above, the phase comparator outputs biased output signals S18 and S19, so as to be able to prevent jitter in the PLL circuit. In this manner, the phase comparator can be used in the PLL circuit for use in extracting the clock signal that identifies and regenerates the receiving signal from the NRZ-signal data Si.

FIG. 4 shows a conceptual diagram of the conventional charge pump provided at the output side.

This charge pump is a circuit which calculates the time average of the pulses in the output signal S18 and S19 outputted from the output terminals 18 and 19 in the phase comparator shown in FIG. 2, and which charges a capacitor C of the loop filter connected thereto. The charge pump circuit includes input terminals 21 and 22, constant-current sources 23 and 27, switches 24 and 26 such as transistors and the like that operate to switch ON and OFF by the output signals S18 and S19, and an output terminal 25 which outputs the output voltage Vp. The constant-current source 23, switch 24, output terminal 25, switch 26 and constant-current source 27 are connected between the power supply potential Vdd and the ground. Upon supply of the output voltage Vp outputted from the output terminal 25, the loop filter 30 including the resistor R and the capacitor C is charged.

Next, the operation of this charge pump circuit will be described.

The switch 24 switches to ON when the output signal S18 is at "H" level, so that the current flows into the loop filter 30 from the constant-current source 23. When the output signal S19 is at "H" level, the switch 26 switches to ON, and the current is pulled out of the loop filter 30 by the constant-current source 27. As a result, the output voltage Vp output from the output terminal 25 is smoothed out by the loop filter 30, so that the control voltage Vc is outputted from the output terminal 31 so as to be supplied to the VCO 32.

However, there is the following problem to be solved in the conventional phase comparator 10 (FIG. 1) having the structure shown in FIG. 2 and FIG. 4.

For example, consider a case where the phase of the data Si matches that of the VCO output signal So in the charge pump shown in FIG. 4. Since the output signals S18 and S19 having the same pulse width are outputted alternately from the output terminals 18 and 19 so as to be inputted to the charge pump shown in FIG. 4, an average value of the current supplied to the loop filter 30 becomes 0. However, the control voltage Vc outputted from the loop filter 30 oscillates at R·Icp at the period of the VCO output signal So, wherein Icp is the current supplied from the charge pump. The frequency of the output signal So of the VCO 32 thereby fluctuates, so that a problem is caused in that a jitter is generated in the clock signal extracted in the PLL circuit.

SUMMARY OF THE INVENTION

Therefore, it is an object of the present invention to provide a phase comparator which overcomes the above drawbacks of the related art.

According to a first aspect of the present invention, a phase comparator comprises: a flip-flop circuit which inputs input data and a clock signal and stores the input data in response to the clock signal; a delay circuit which inputs the input data and delays the input data by a predetermined angle of 0°–180° where a data input of the flip-flop circuit is connected to a data input of the delay circuit; a first logic gate which inputs the input data and an output signal of the flip-flop circuit and which outputs a first output signal by taking an exclusive OR or exclusive NOR of the input data and the flip-flop output signal; and a second logic gate which inputs the input data and an output signal of the delay circuit and which outputs a second output signal by taking an exclusive OR or exclusive NOR of the input data and the delay circuit output signal.

By implementing the above structure, the input data are stored in the flip-flop circuit in response to the clock signal. The first logic gate takes an exclusive OR or exclusive NOR of the input data and the flip-flop outputs signal so as to output the first output signal. On the other hand, the input data are delayed by the delay circuit by a predetermined angle. The second logic gate takes an exclusive OR or exclusive NOR of the input data and the delay circuit output signal so as to output the second output signal.

According to a second aspect of the present invention, there is provided a phase comparator which comprises: a flip-flop circuit which inputs input data, inverted data thereof and a clock signal, and which stores the input data and the inverted data in response to the clock signal; a delay circuit which inputs the input data and the inverted data, and which delays the input data and the inverted data by a predetermined angle of 0° through 180°; a first transfer gate which inputs the input data, the inverted data and an output of the flip-flop circuit, and which transmits an output of the flip-flop circuit when the input data are at a logic "H" level; a second transfer gate which inputs the input data, the inverted data and an inverted output of the flip-flop circuit, and which transmits the inverted output of the flip-flop circuit when the input data are at a logic "L" level; a first logic inversion circuit which inputs outputs of the first and second transfer gates, and which outputs an first output signal by inverting a summed-up value of two outputs of the first and second transfer gates; a third transfer gate which inputs the input data, inverted data and an output signal of the delay circuit, and which transmits the output signal of the delay circuit when the input data are at a logic "H" level; a fourth transfer gate which inputs the input data, the inverted data and an inverted out-put signal of the delay circuit, and which transmits the inverted output: signal of the delay circuit when the input data is at a logic "L" level; and a second logic inversion circuit which inputs outputs of the third and fourth transfer gates, and which outputs a second output signal by inverting a summed-up value of the two outputs of the third and fourth transfer gates.

By implementing the above structure, the input data and the inverted data are stored in the flip-flop circuit. When the input data are at a logic "H" level, the output signal of the flip-flop circuit is outputted via the first transfer gate. When the input data are at a logic "L" level, the output signal of the flip-flop circuit is outputted via the second transfer gate. After the output signals of the first and second transfer gates are summed up, the summed-up output signal is inverted by the first inverter. On the other hand, the input data and the inverted data are delayed by the delay circuit by a predetermined angle. When the input data are at a logic "H" level, the output signal of the delay circuit is outputted via the third transfer gate. When the input data are at a logic "L" level, the inverted output signal of the delay circuit is outputted via the fourth transfer gate. After the output signals of the third and fourth transfer gates are summed up, the summed-up output signal is inverted by the second inverter.

According to a third aspect of the present invention, in addition to the above first and second aspects of the present invention there is further provided a converter which includes: a third logic gate which inputs the first output signal and the second output signals, and takes exclusive OR or exclusive NOR of the two signals; a first output circuit which inputs the first output signal and an output signal of said third logic gate, and detects whether or not said two signals match, so as to output a phase-delay signal in the event that said two signals match; and a second output circuit which outputs the second output signal and an output signal of said third logic gate, and detects whether or not said two signals match, so as to output a phase-forward signal in the event that said two signals match.

By implementing the above structure, the third logic gate takes an exclusive OR or exclusive NOR of the first output signal and the second output signal outputted from the first logic gate and the second logic gate, respectively (or, outputted from the first logic inversion circuit and the second logic inversion circuit, respectively) according to the above first and second aspects of the invention. The first output circuit detects whether or not the first output signal from the first logic gate and the output signal of the third logic gate match, and outputs the phase-delay signal when the two signals match. The second output circuits detects whether or not the second output signal from the second logic gate and the output signal of the third logic gate match, and outputs the phase-forward signal when the two signals match.

According to a fourth aspect of the present invention, in the above third aspect of the invention each output circuit (of the first output circuit and the second output circuit) includes a logic gate which performs an AND or NAND of data applied at the data input terminals of that output circuit. Thereby, the logic gate takes an AND or NAND of the first output signal and the output signal of the third logic gate, while the logic gate takes an AND or NAND of the second output signal and the output signal of the third logic gate.

According to a fifth aspect of the present invention, in addition to the above first and second aspects of the present invention there is further provided a converter which includes: a first logic circuit, which inverts the first output signal or inverts the inverted first output signal; a second logic circuit, which inverts an output signal of the first logic circuit or inverts the inverted signal so that a phase-delay signal is produced; a third logic circuit which inverts the second output signal or inverts the inverted second output signal; a fourth logic circuit which inverts an output signal of the third logic circuit so that a phase-forward signal is produced; a first switching element which is switched by the first output signal so as to set an output signal of said third logic circuit to a constant potential; and a second switching element which is switched by the second output signal so as to set the first output signal to a constant potential.

By implementing these structures, the first output signal outputted from the first logic gate (or the first logic inversion circuit) according to the first and second aspects of the present invention, is inverted, or this inverted first output signal is inverted. The first output signal outputted from the second logic gate (or the second logic inversion circuit) according to the first and second aspects of the present invention, is inverted, or this inverted first output signal is inverted. For example, when the first output signal is at a "H" level, the first switching element is switched ON, so that the output signal of the third logic circuit is set to a constant potential. Moreover, when the second output: signal is at a "H" level, the second switch is switched ON, so that the output signal of the first logic circuit is set to a constant potential. The output signal of the first logic circuit is inverted by the second logic circuit or this inverted output signal is inverted, so that the phase-delay signal is outputted. The output signal of the third logic circuit is inverted by the fourth logic circuit or this inverted output signal is inverted, so that the phase-forward signal is outputted.

According to a sixth aspect of the present invention, there is provided a phase locked loop circuit which comprises: a phase comparator which includes: a flip-flop circuit which inputs input data and a clock signal and stores the input data in response to the clock signal; a delay circuit which inputs the input data and delays the input data by a predetermined angle; a first logic gate which inputs the input data and an output signal of the flip-flop circuit and which outputs a first output signal by taking an exclusive OR or exclusive NOR thereof; a second logic gate which inputs the data and the output signal of the delay circuit and which outputs a second output signal by taking an exclusive OR or exclusive NOR thereof; a converter which generates pulses proportional to the phase of the input data and the phase of a voltage controlled oscillator; a charge pump circuit, connected to the converter, which calculates a time average of pulses outputted from the phase comparator; the PLL circuit further comprising: a loop filter, comprised of a resistor and a capacitor and connected to an output side of the charge pump circuit, and which smoothes the output voltage and extracts a control voltage proportional to the phase difference; and the voltage controlled oscillator which controls an oscillation frequency by the control voltage outputted from the loop filter, whereby the output signal is fed back to the comparator so as to serve as the clock signal.

According to a seventh aspect of the present invention, there is provided a phase locked loop circuit which comprises: a phase comparator which includes: a flip-flop circuit which inputs input data, inverted data thereof and a clock signal, and which stores the input data and the inverted data in response to the clock signal; a delay circuit which inputs the input data and the inverted data, and which delays the input data and the inverted data by a predetermined angle of 0° through 180°; a first transfer gate which inputs the input data, the inverted data and an output of said flip-flop circuit, and which transmits an output of said flip-flop circuit when the input data are at a logic "H" level; a second transfer gate which inputs the input data, the inverted data and an inverted output of the flip-flop circuit, and which transmits the inverted output of the flip-flop circuit when the input data are at a logic "L" level; a first logic inversion circuit which inputs outputs of the first and second transfer gates, and which outputs a first output signal by inverting a summed-up value of two outputs of said first and second transfer gates; a third transfer gate which inputs the input data, inverted data and an output signal of said delay circuit, and which transmits the output signal of said delay circuit when the input data are at a logic "H" level; a fourth transfer gate which inputs the input data, the inverted data and an inverted output signal of said delay circuit, and which transmits the inverted output signal of said delay circuit when the input data is at a logic "L" level; and a second logic inversion circuit which inputs outputs of said third and fourth transfer gates, and which outputs a second output signal by inverting a summed-up value of the two outputs of said third and fourth transfer gates; a converter, connected to the first logic conversion circuit and the second logic conversion circuit, which generates pulses proportional to the phase of the input data and the phase of a voltage controlled oscillator; and a charge pump circuit, connected to an output side of said converter, which calculates a time average of pulses outputted from the converter; the PLL circuit further comprising:

a loop filter, comprised of a resistor and a capacitor and connected to an output side of said charge pump circuit, and which smoothes the output voltage and extracts a control voltage proportional to the phase difference; and the voltage controlled oscillator which controls an oscillation frequency by the control voltage.

BRIEF DESCRIPTION OF THE DRAWINGS

FIGS. 6A to 6C are timing charts showing the operations for the phase comparator shown in FIG. 5.

DESCRIPTION OF THE PREFERRED EMBODIMENTS

First Embodiment

Figure 5:
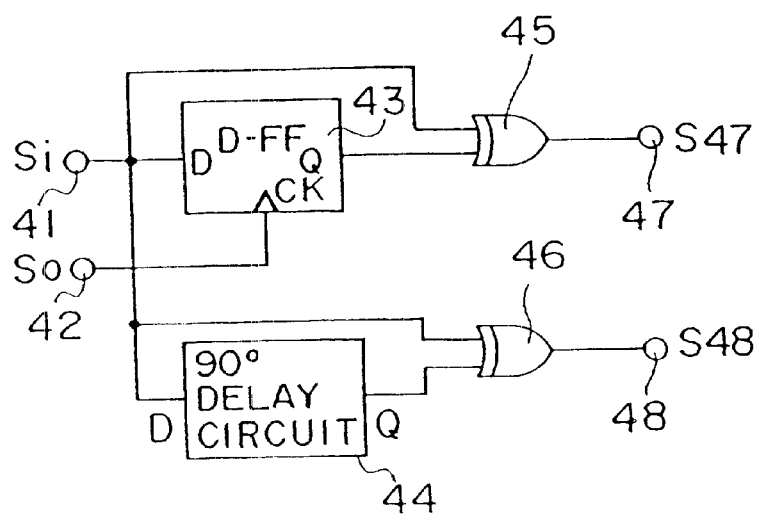
FIG. 5 is a circuit diagram of a phase comparator according to a first embodiment of the present invention.

FIG. 5 is a circuit diagram of a phase comparator according to a first embodiment of the present invention.

Figure 1:
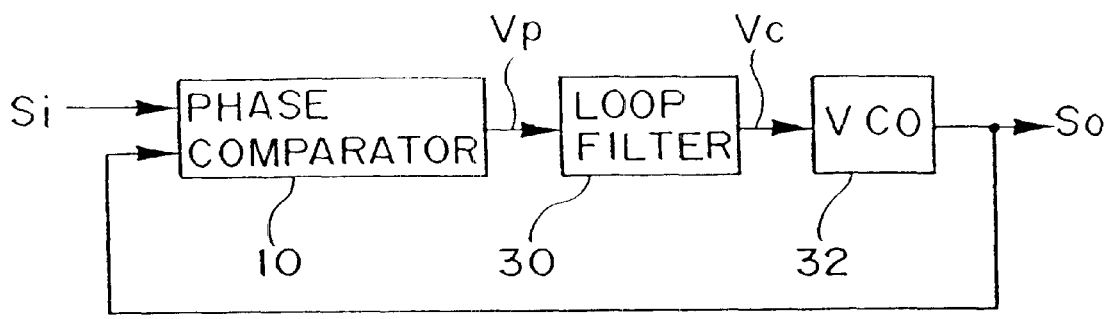
FIG. 1 is a structural view of a phase locked loop circuit used conventionally and generally.
Figure 2:
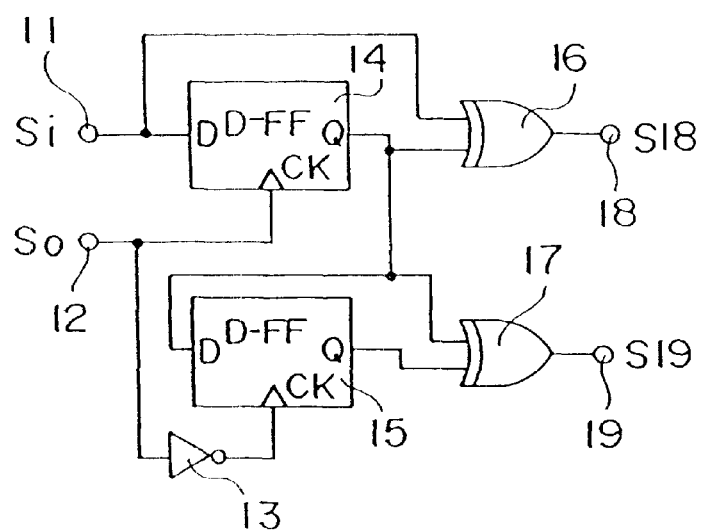
FIG. 2 is a circuit diagram of the phase comparator described in publication (1) and shown in FIG. 1.
Figure 3A:
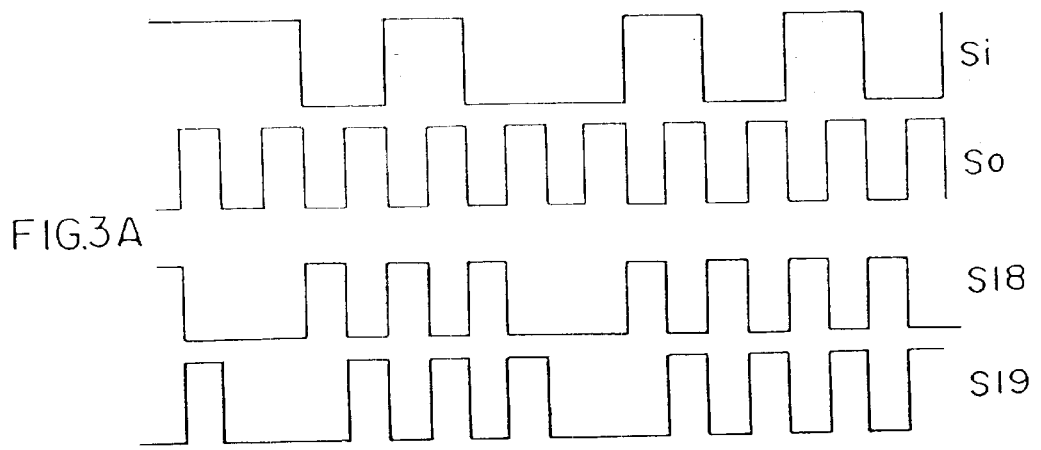
FIGS. 3A to 3C are timing charts showing the operation of the phase comparator shown in FIG. 2.
Figure 3B:
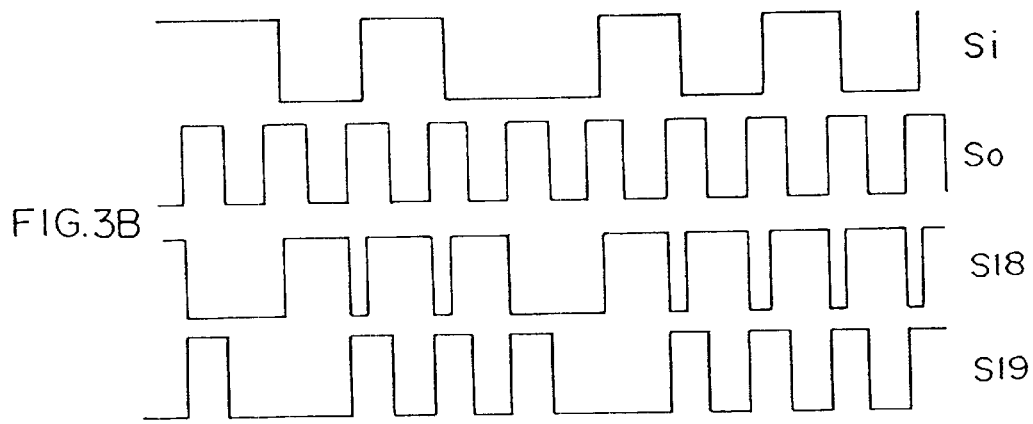
Figure 3C:
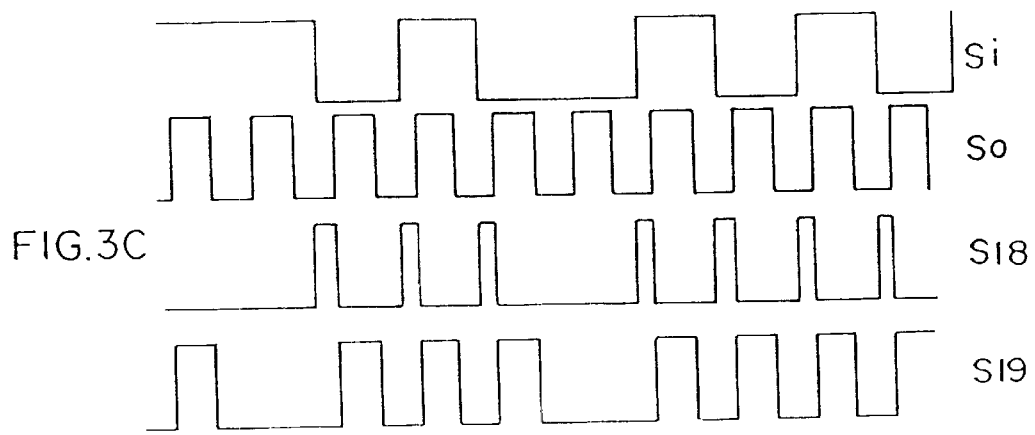

The phase comparator shown in FIG. 5 is, for example, provided in a PLL circuit shown in FIG. 1, and is comprised of an input terminal 41 which inputs data Si, an input terminal 42 which inputs a VCO output signal So, a flip-flop (for example, D-FF) 43 and a delay circuit 44. The D-FF 43 includes a data input terminal D connected to the input terminal 41, a clock input terminal CK connected to the input terminal 42, and an output terminal Q connected the output signal, so that the data Si input from the data input terminal D is detected at a positive edge of a clock signal (for example, the VCO output signal So) inputted from the clock input terminal CK so as to be stored. The delay circuit 44 includes a data input terminal D connected to the input terminal 41 and an output terminal Q, so that a phase of the data Si inputted from the input terminal D is delayed by a predetermined angle which is greater than or equal to 0° and less than 180° (for example, 90°).

The input terminal 41 and the output terminal Q of the D-FF 43 are connected to an input terminal of a first logic gate (for example, 2-input EXOR gate) 45. The EXOR gate 45 takes the exclusive OR of the data Si and the output signal of D-FF 43, so that a first output signal S47 is outputted to an output terminal 47. The input terminal 41 and the output terminal Q of the delay circuit 44 are connected to an input terminal of a second logic gate (for example, 2-input EXOR gate) 46. The EXOR gate 46 takes the exclusive OR of the data Si and the output signal of the delay circuit 44, so that a second output signal S48 is outputted to an output terminal 48.

Figure 6B:
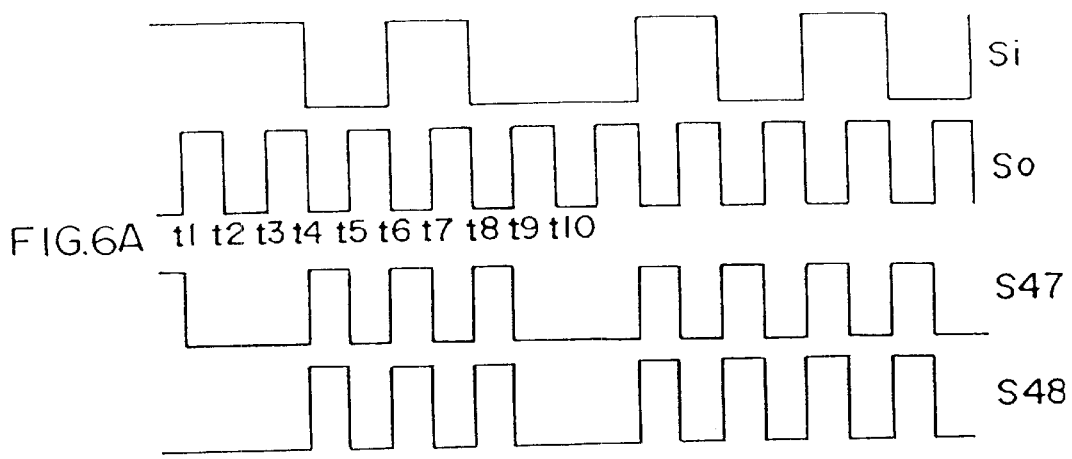
Figure 6B:
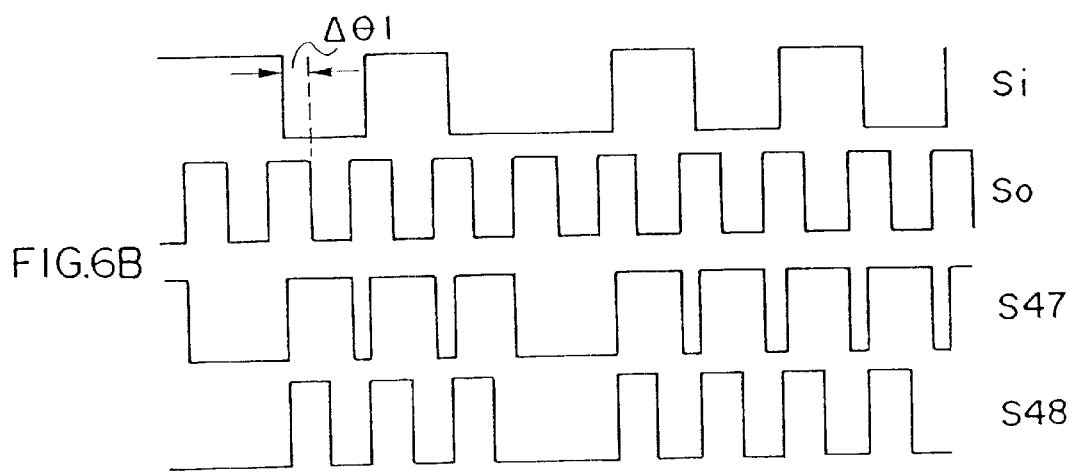
Figure 6C:
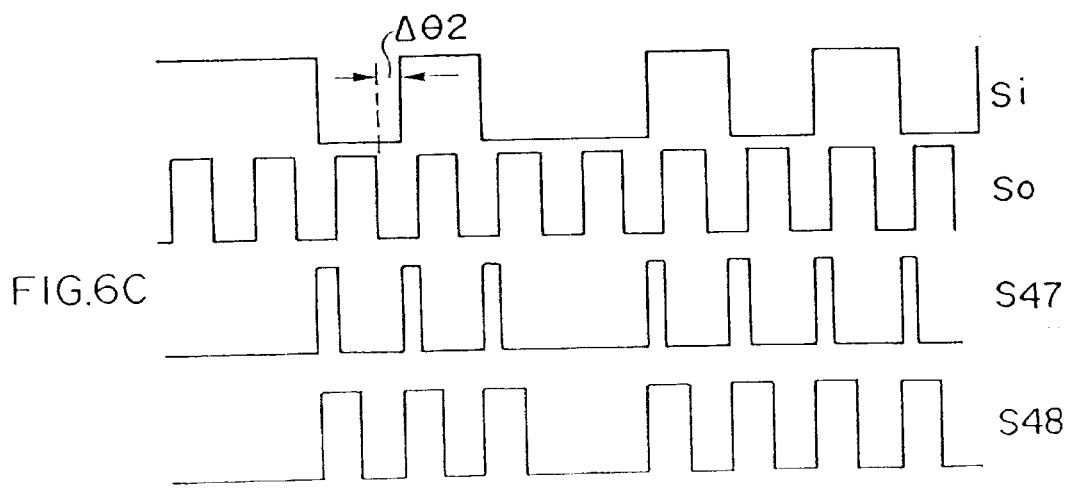

FIGS. 6A through 6C are timing charts showing the operations for the phase comparator shown in FIG. 5. FIG. 6A is a timing chart showing a case where the phase of the data Si matches that of the VCO output signal So. FIG. 6B is a timing chart showing a case where the phase of the VCO output signal So is displaced so as to be delayed with respect to that of the data Si. FIG. 6C is a timing chart showing a case where the phase of the VCO output signal So is displaced so as to be ahead with respect to that of the data Si. Hereinafter, the operations of the phase comparator shown in FIG. 5 will be described with reference to FIGS. 6A through 6C.

For example, let us consider a case where the data Si repeat 0, 1, 0, 1. Then, when the VCO output signal So rises to an "H" level at time t1, the "H" level (that is "1") of the data Si is inputted to the D-FF 43, so that the output terminal Q of the D-FF 43 rises to the "H" level. When the VCO output signal So rises to the "H" level at time t3, the output terminal Q maintains the "H" level because the data Si are at the "H" level (that is "1"). When the VCO output signal So rises to the "H" level at time t5, the output terminal Q is brought down to the "L" level because the data Si are at "L" level (that is "0"), and this "L" level is inputted to the D-FF 43. When the VCO output signal So rises to the "H" level at time t7, the output terminal Q of the D-FF 43 rises to the "H" level since the data Si are at the "H" level (that is "1") and this "H" level is inputted to the D-FF 43. Thereafter, the same operation is repeated.

The exclusive OR is taken on the output signal outputted from the output terminal Q of the D-FF 43 and the data Si, at the EXOR gate 45, so that the first output signal S47 is outputted from the output terminal 47. Namely, the EXOR gate 45 outputs the output signal S47 where the data Si are inverted when the output terminal Q of the D-FF 43 is at the "H" level, while the EXOR gate 45 outputs the output signal S47 which is the data Si itself when the output terminal Q of the D-FF 43 is at the "L" level.

On the other hand, when the data Si fall to an "L" level (that is "0") at time t4, this fall is delayed by the delay circuit 44 by 90°, so that the output terminal Q of the delay circuit 44 falls to the "L" level at time t5. When the data Si rise to the "H" level (that is "1") at time t6, this rise is delayed by the delay circuit 44 by 90°, so that the output terminal Q of the delay circuit 44 rises to the "H" at time t7.

The exclusive OR is taken on the output signal of the delay circuit 44 and the data Si, at the EXOR gate 46, so that the second output signal S48 is outputted from the output terminal 48. Namely, The EXOR gate 46 outputs the output signal S48 where the data Si are inverted when the output signal of the delay circuit 44 is at the "H" level, while the EXOR gate 46 outputs the output signal S48 which is the data Si itself when the output signal of the delay circuit 44 is at the "L" level.

As shown in FIG. 6A, when the phase of the data Si matches that of the VCO output signal So, the output terminals 47 and 48 repeat outputting the pulse of the same pulse width (output signals S47 and S48) at a period of the VCO output signal So. Then, the output terminals 47 and 48 output the output signals S47 and S48 at the same phase, respectively.

Referring to FIG. 6B, when the phase of the VCO output signal So is displaced in a delayed manner with respect to that of the data Si by Δθ1, the output terminal 47 generates a pulse (output signal S47) having a broader pulse width corresponding to the phase delay of Δθ1.

Referring to FIG. 6C, when the phase of the VCO output signal So is ahead of the data Si by Δθ2, the output terminal 47 generates a pulse (output signal S47) having a narrow pulse width corresponding to the phase forwarding of Δθ2.

Thus, a difference between the time average of the output signal S47 and the time average of the output signal S48 is proportional to the phase difference thereof in a range of −π through +π so as to operate as a phase comparator.

The output signals S47 and S48 become "0" when the data Si are a sequence of 0's or 1's (e.g. 1,1,1 ... or 0,0,0 ...). Thus, when the same-value data Si are inputted in sequence, because the phase comparator outputs the same continuous output signals S47 and S48, the cause of the jitter of the PLL circuit is prevented. Thus, the phase comparator according to the present embodiment can be used for a PLL circuit for use in extracting a clock signal by which a receiving signal is identified and reproduced from the data Si of the NRZ (Non-Return-to-Zero) signal.

Figure 4:
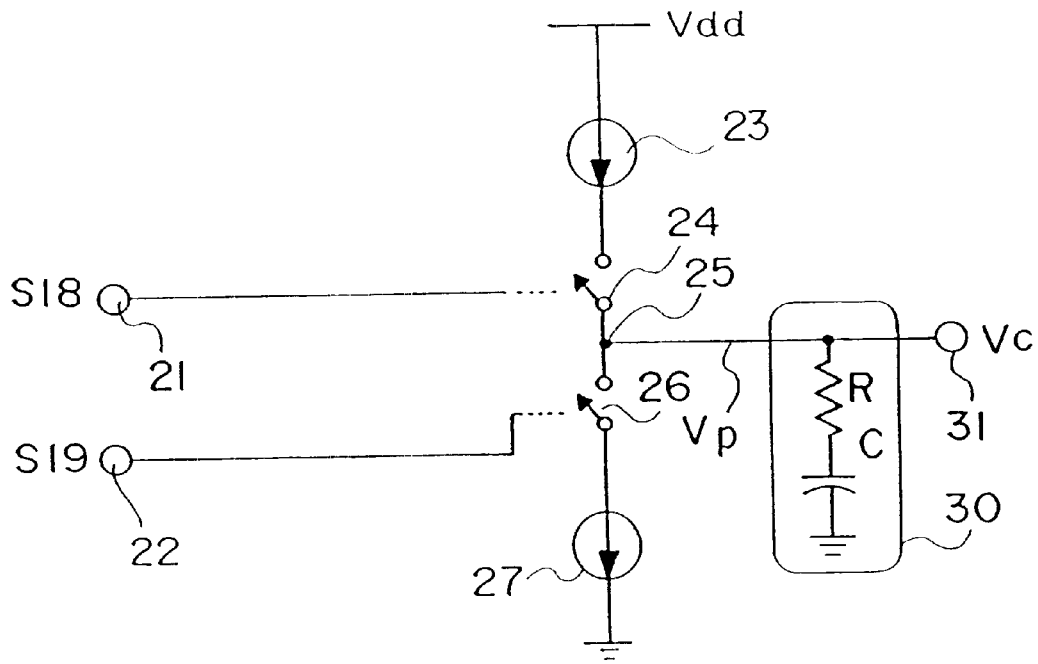
FIG. 4 is a conceptual diagram of the conventional charge pump provided at the output side.

Next, operation, which is performed when the output signals S47 and S48 of the phase comparator shown in FIG. 5 are fed to the charge pump shown in FIG. 4, will be described.

When the phase of the data Si matches that of the VCO output signal So, the pulses having the same pulse width (i.e. the output signals S47 and S48) are simultaneously outputted from the terminals 47 and 48. Thus, the switches 24 and 26 switch to ON, and the current supplied to the loop filter 30 becomes zero. Thus, the conventionally problematic vibration due to a control voltage Vc which is outputted from the loop filter 30 and caused at the time of the phase matching will not occur. Therefore, the jitter will not be caused in the clock signal in the PLL circuit, and thus, high-speed response and high-precision phase identification for the PLL circuit can be achieved.

Second Embodiment

Figure 7:
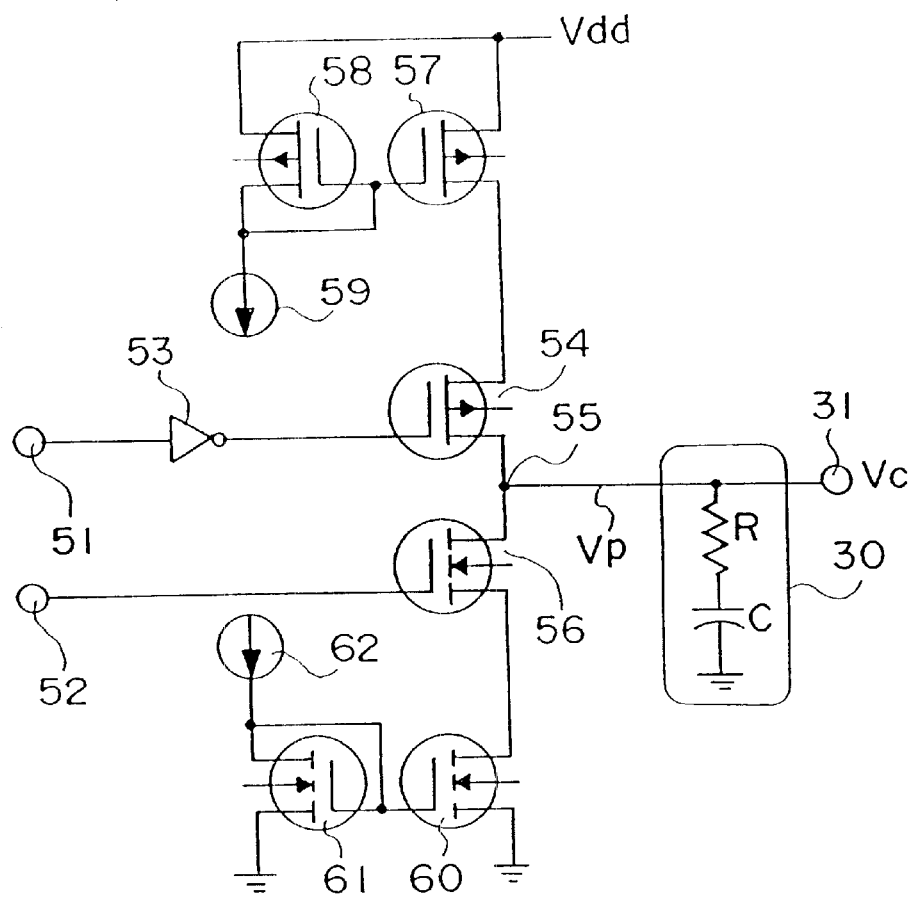
FIG. 7 is a schematic diagram of a charge pump according to a second embodiment of the present invention.

FIG. 7 is a schematic diagram of a charge pump according to a second embodiment of the present invention. The charge pump includes input terminals 51 and 52 which input the output signals S47 and S48 and the like. The gate of a p-channel type MOS Field Effect Transistor (simply referred to as PMOS hereinafter) 54 is connected to the input terminal 51 via an inverter 53 for use in inverting the signal thereof. The gate of an N-channel type MOS Field Effect Transistor (simply referred to as NMOS hereinafter) 56 is connected to the input terminal 52. The drain of PMOS 54 is connected to the drain of the NMOS 56 via an output terminal 55 from which an output voltage Vp is outputted.

The source of the PMOS 54 is connected to a power supply potential Vdd via a PMOS 57. A constant-current source 59 is connected to the power supply potential Vdd via a PMOS 58. The gate of the PMOS 58 is connected to the gate of the PMOS 57, and a connecting line between the gate of PMOS 58 and the gate of PMOS 57 is further connected to the drain of the PMOS 58. The source of the NMOS 56 is connected to the ground via an NMOS 60. Moreover, a constant-current source 62 is connected to the ground via an NMOS 61.

The loop filter 30 which includes a resistor R and a capacitor C is connected to the output terminal 55. A control voltage Vc outputted from this loop filter 30 is outputted from an output terminal 31.

The PMOS 57 and PMOS 58 form a current mirror circuit, so that the current which corresponds to the current flowing through the source-drain of the PMOS 58 flows through the source-drain of the PMOS 57. It is to be noted that the PMOS 57, PMOS 58 and constant-current source 59 correspond to the constant-current source 23 shown in FIG. 4. The PMOS 54 corresponds to the switch 24 shown in FIG. 4 while the NMOS 56 corresponds to the switch 26 shown in FIG. 4. The NMOS 60 and NMOS 61 form a current mirror circuit, so that the current which corresponds to the current flowing through the drain-source of the NMOS 61 flows through the drain-source of the NMOS 60. It is to be noted that the NMOS 60, NMOS 61 and constant-current source 62 correspond to the constant-current source 27 shown in FIG. 4.

Next, the operation of the charge pump shown in FIG. 7 will be described.

For example, when the output signal S47 shown in FIG. 5 is inputted to the input terminal 51 shown in FIG. 7, and the output signal S48 (FIG. 5) is inputted to the input terminal 52 (FIG. 7), the output signal S47 thus inputted to the terminal 51 is inverted by the inverter 53 and is then inputted to the gate of the PMOS 54 while the output signal S48 thus inputted to the terminal 52 is inputted to the gate of the NMOS, 56. The PMOS 54 is in the OFF state when the output signal of the inverter 53 is at "H" level, while the PMOS 54 is in the ON state when the output signal of the inverter 53 is at "L" level. The NMOS 56 is in the ON state when the output signal S48 thus inputted to the terminal 52 is at "H" level, while the PMOS 56 is in the OFF state when the output signal S48 is at "L" level. The output voltage Vp is outputted from the output terminal 55 by the on-off operation of the PMOS 54 and the NMOS 56. The output voltage Vp is smoothed up by the loop filter, so that the control voltage Vc is outputted from the output terminal 31.

On the other hand, when the input terminals 51 and 52 are simultaneously set to the "H" level, it is difficult to realize a state in which no current flows into the loop filter 30 since the flow of the current into and out of the loop filter 30 depends on the control voltage Vc which is outputted from the loop filter 30 and the ON-resistance of the PMOS 54 and the NMOS 56. In order to realize a state in which no current flows into the loop filter 30, it suffices that the PMOS 54 and NMOS 56 not be ON when the input terminals 51 and 52 are at the "H" level simultaneously. Thus, such a converter as shown in FIG. 8 may be connected to the input terminals 51 and 52.

Figure 8:
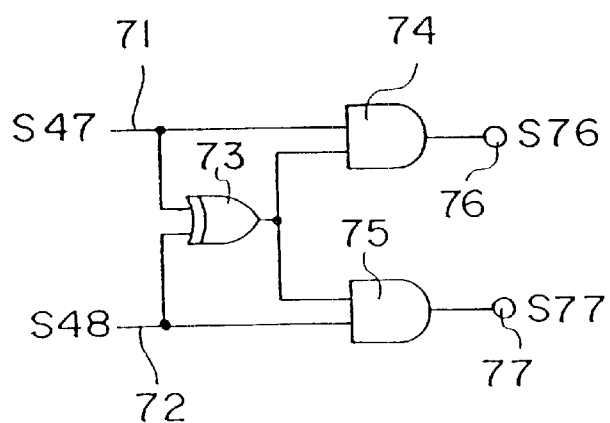
FIG. 8 is a structural view of a converter which is connected to an input side of the charge pump shown in FIG. 7.

FIG. 8 shows a structure of a converter which is connected to an input side of the charge pump shown in FIG. 7.

The converter shown in FIG. 8 includes input terminals 71 and 72 which input the output signals S47 and S48 outputted from the phase comparator shown in FIG. 5, respectively. The input terminals of a third logic gate (for example, 2-input EXOR gate) 73 are connected to both of the input terminals 71 and 72. The input terminals of a first output circuit (for example, 2-input AND gate) 74 are connected to both the input terminal 71 and the output terminal of the EXOR gate 73. The first output circuit 74 detects whether or not the output signal S47 matches the output signal of the EXOR gate 73, and outputs a phase-delay signal S76 when S47 matches the output signal of the EXOR gate 73. The output terminal of the first output circuit 74 is connected to the output terminal 76 which outputs the phase-delay signal S76. The input terminal 72 and the output terminal of the EXOR gate 73 are connected to the input terminals of a second output circuit (for example, 2-input AND gate) 75. The second output circuit detects whether or not the output signal S48 matches the output signal of the EXOR gate 73, and outputs a phase-forward signal S77 when S48 matches the output signal of the EXOR gate 73. The output terminal of the second output circuit is connected to the output terminal 77 which outputs the phase-forward signal S77.

Figure 9A:
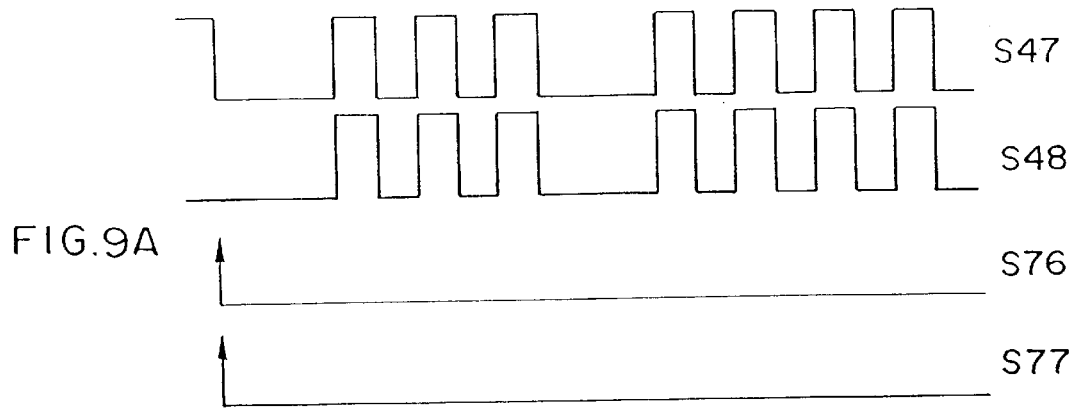
FIGS. 9A to 9C are timing charts showing the operation of the PLL circuit using the converter shown in FIG. 8.
Figure 9B:
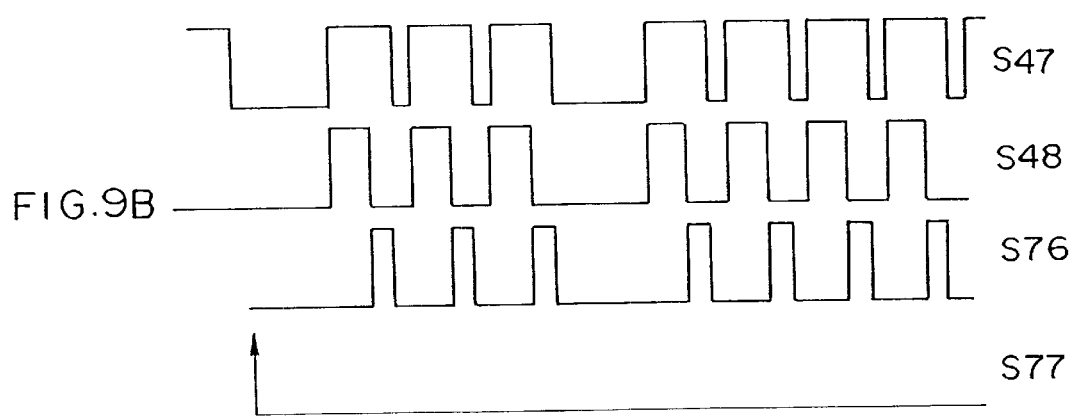
Figure 9C:
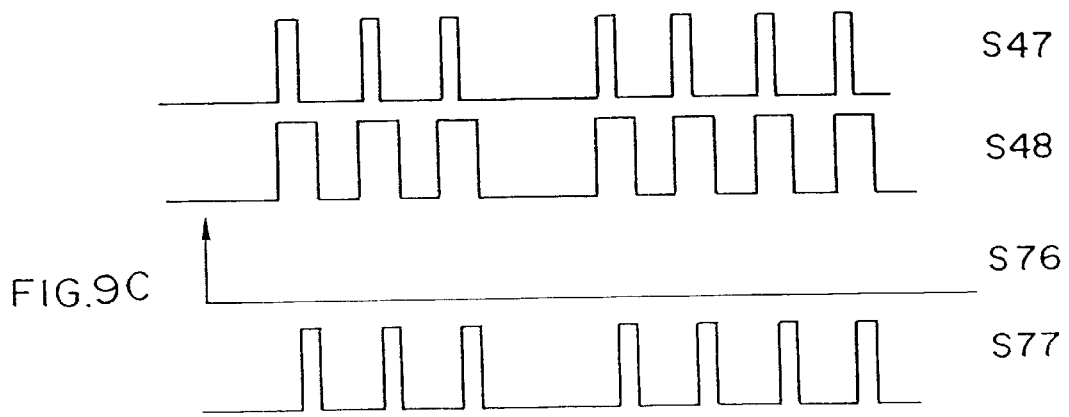

FIGS. 9A to 9C are timing charts showing the operation of the PLL circuit using the converter shown in FIG. 8. FIG. 9A is a timing chart where the phase of the data Si matches that of the VCO output signal So; FIG. 9B is a timing chart where the phase of the VCO output signal So is more delayed than that of the data Si; and FIG. 9C is a timing chart where the output signal So of the VCO is ahead of the data Si. Hereinafter, the operation of the converter shown in FIG. 8 will be described with reference to FIGS. 9A through 9C.

The first and second output signals S47 and S48 are outputted to the input terminals 71 and 72, respectively. The EXOR gate 73 inverts the thus-inputted output signal S47 such that the output signal S47 is outputted therefrom when the thus-inputted output signal S48 is at the "H" level. The EXOR gate 73 outputs the thus-inputted output signal S47 as it is when the output signal S48 is at the "L" level. The thus-inputted output signal S47 and the output signal of the EXOR gate 73 are taken with an AND (logic product) at the AND gate 74, so that the phase-delay signal S76 is outputted from the output terminal 76. The thus-inputted output signal S48 and the output signal of the EXOR gate 73 are taken with an AND (logic product) at the AND gate 75, so that the phase-forward signal S77 is outputted from the output terminal 77.

Referring to FIG. 9A, when the phase of the input data Si matches that of the VCO output signal So, both the phase-delay signal S76 and the phase-forward signal S77 outputted from the output terminals 76 and 77, respectively are at the "L" level.

Referring to FIG. 9B, when the phase of the VCO output signal So is delayed with respect to that of the input data Si, a pulse (that is, the pulse-delay signal S76) having a pulse width corresponding to the delayed phase is outputted from the output terminal 76, so that the phase-forward signal S77 outputted from the terminal 77 is always at the "L" level.

Referring to FIG. 9C, when the phase of the VCO output signal So is ahead of that of input data Si, a pulse having a pulse width corresponding to the phase being ahead of that of Si (the phase-forward signal S77) is outputted from the output terminal 77, so that the phase-delay signal 76 outputted from the output terminal 76 is constantly at the "L" level.

When the phase-delay signal S76 and the phase-forward signal S77 outputted from the converter are input to the input terminals 51 and 52, respectively, the converter can generate a pulse which is proportional to the phase of the data Si and the phase of the VCO output signal So. Thus, a problem possibly related to the charge pump circuit shown in FIG. 7 can be avoided.

Third Embodiment

Figure 10:
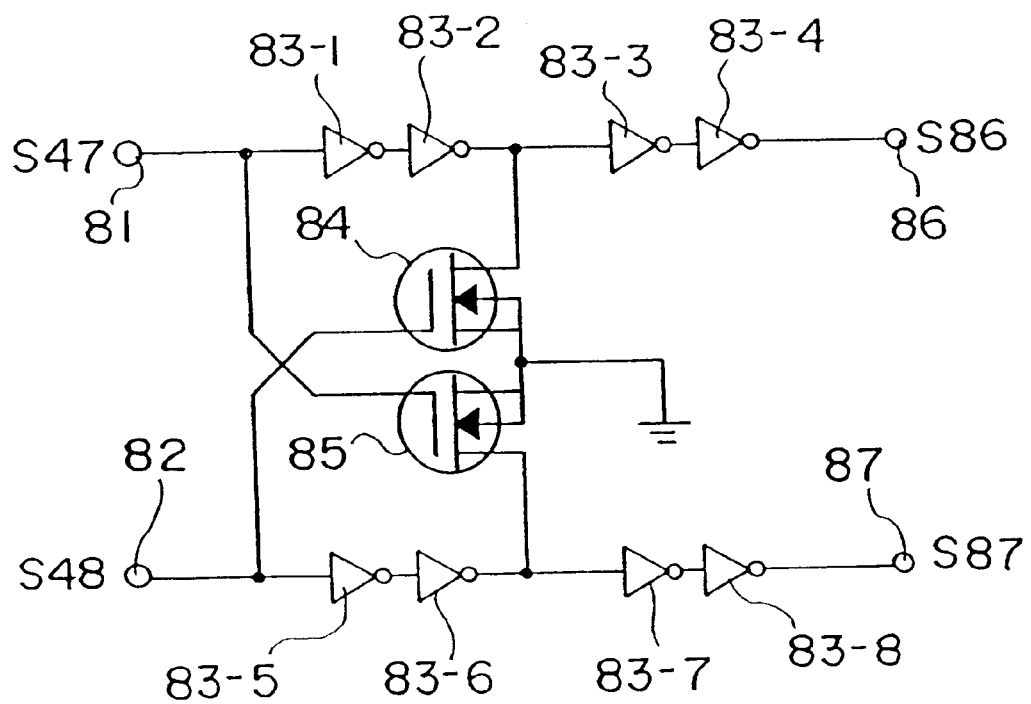
FIG. 10 is a structural view of a converter according to third embodiment of the present invention.

FIG. 10 shows a structure of a converter according to a third embodiment.

This converter has a similar function to the converter shown in FIG. 8. Referring to FIG. 10, the converter includes input terminals 81 and 82 which input the first and second output signals S47 and S48, respectively, of the phase comparator shown in FIG. 5. A first logic circuit (for example, 2-stage inverters 83-1 and 83-2) which inverts the thus-inputted first output signal S47 or inverts this inverted signal, is connected to the input terminal 81. Moreover, at the output side of the first logic circuit, there is connected a second logic circuit (for example, 2-stage inverters 83-3 and 83-4) which inverts an output signal of the inverter 83-2 or inverts this inverted signal so as to output a phase-delay signal S86.

A third logic circuit (for example, 2-stage inverters 83-5 and 83-6) which inverts the thus-input first output signal S48 or inverts this inverted signal is connected to the input terminal 82. Moreover, to the output side of the third logic circuit, there is connected a fourth logic circuit (for example, 2-stage inverters 83-7 and 83-8) which inverts an output signal of the inverter 83-6 or inverts this inverted signal. An output terminal 87 which outputs the phase-forward output signal S87 is connected to the output terminal of the inverter 83-8.

A point between the output terminal of the inverter 83-2 and a constant potential (for example, ground potential=0 V) is connected to a second switching element such as an NMOS 84 such that the output terminal of the inverter 83-2 can be set to the ground potential by the switching performed by the second output signal S-48. A point between the output terminal of the inverter 83-6 and a constant potential (for example, ground potential=0 V) is connected to a first switching element such as an NMOS 85 such that the output terminal of the inverter 83-6 can be set to the ground potential by the switching performed by the first output signal S47.

Next, the operation of the converter shown in FIG. 10 will be described.

The first and second output signals S47 and S48 outputted from the comparator shown in FIG. 5 are inputted to the input terminals 81 and 82, respectively. The output signal S47 inputted to the input terminal 81 is inverted by the inverter 83-1, and this inverted output signal is inverted by the inverter 83-2. The output signal S48 inputted to the input terminal 82 is inverted by the inverter 83-5, and this inverted output signal is inverted by the inverter 83-6. Then, the NMOS 84 is in an ON state when the output signal S48 is at "H" level while the NMOS 84 is in an OFF state when the output signal S48 is at "L" level. The NMOS 85 is in an ON state when the output signal S47 is at "H" level while the NMOS 85 is in an OFF state when the output signal S47 is at "L" level.

When the NMOS 84 is switched to an ON state, the output terminal of the inverter 83-2 is set to the ground potential. Similarly, when the NMOS 85 is in an ON state, the output terminal of the inverter 83-6 is set to the ground potential. The output signal of the inverter 83-2 is inverted by the inverter 83-3, and this inverted output signal is inverted by the inverter 83-4. Thereafter, the phase-delay signal S86 is outputted from the output terminal 86. The output signal of the inverter 83-6 is inverted by the inverter 83-7, and this output signal is inverted by the inverter 83-8, so that the phase-forward signal S87 is outputted from the output terminal 87.

In the converter shown in FIG. 10, the phase-delay signal S86 and the phase-forward signal S87 outputted from the output terminals 86 and 87, respectively, are at "L" level when the output signals S47 and S48 that are inputted from the input terminals 81 and 82 are simultaneously at "L" level. The "H"-level phase-delay signal S86 is outputted from the output terminal 86 when the output signal S47 only is at "H" level, while the "H"-level phase-forward signal S87 is outputted from the output terminal 87 when the output signal S48 only is at "H" level. Thus, the converter shown in FIG. 10 has the same functions as the converter shown in FIG. 8.

Moreover, since the converter according to the third embodiment has a simpler circuit configuration and the direction of the signals are in one direction, there is no need to take into account the difference of the delay time of the signals which is generated for each logic element (as compared to the converter shown in FIG. 8), so that the converter according to the third embodiment is suitable for high-speed operation.

Fourth Embodiment

Figure 11:
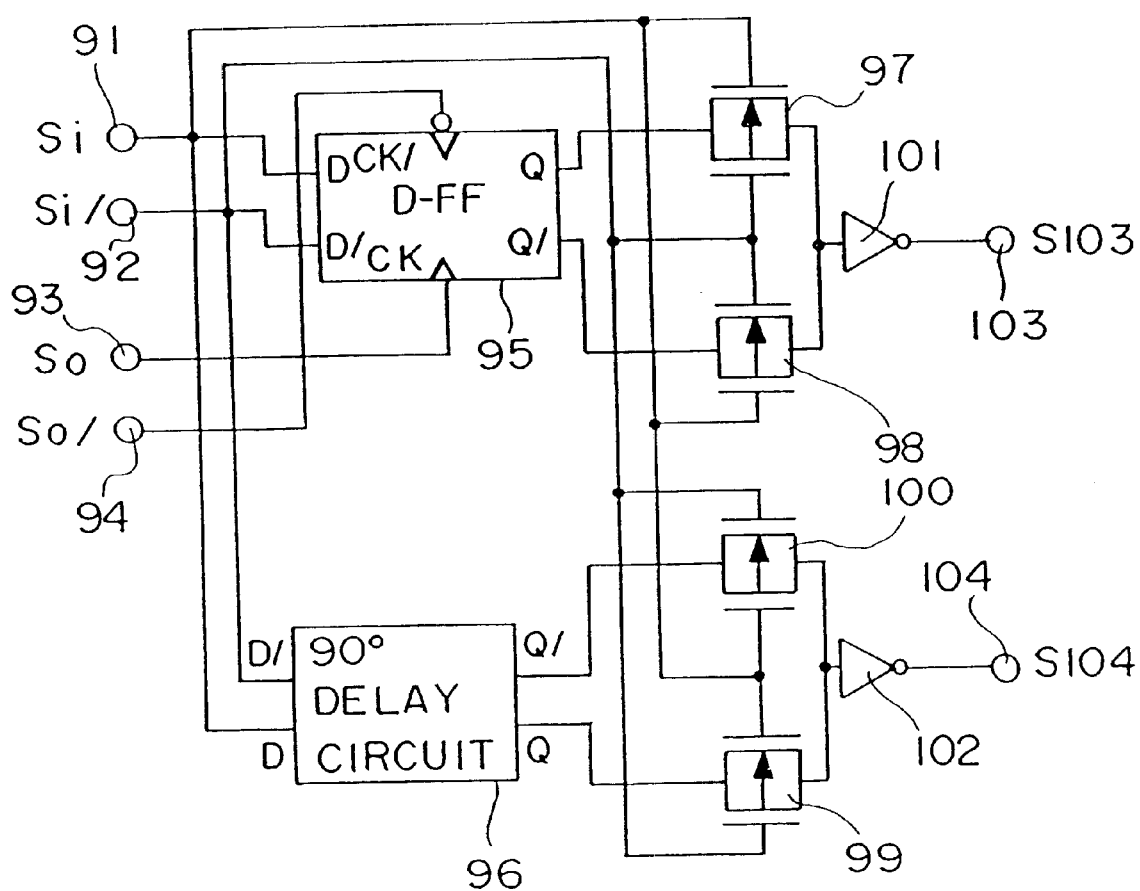
FIG. 11 is a structural view a phase comparator according to a fourth embodiment of the present invention.

FIG. 11 shows a phase comparator according to a fourth embodiment of the present invention.

This phase comparator corresponds to the phase comparator according to the first embodiment shown in FIG. 5, and has a dual structure in which the data Si and its inverted data Si/ are simultaneously inputted to the comparator.

The phase comparator according to the fourth embodiment is comprised of an input terminal 91 which inputs data Si, an input terminal 92 which inputs the inverted data Si/, an input terminal 93 which inputs a clock signal such as the VCO output signal So, an input terminal 94 which inputs a VCO inverted output signal So/, a flip-flop 95 such as delay flip-flop (simply referred to as D-FF 95) which stores the data Si and the inverted data Si/ in response to the VCO output signal So, a delay circuit 96 which delays the data Si and the inverted data Si/ by a predetermined angle which is greater than or equal to 0° and less than 180° (for example, 90°) compared to the phase of the data Si.

The D-FF 95 comprises a data input terminal D which inputs data Si, an inverted data input terminal D/ which inputs the inverted data Si/, a clock input terminal CK which inputs the VCO output signal So, an inverted clock input terminal CK/ which inputs the VCO inverted output signal So/, an output terminal Q which outputs data, an inverted output terminal and an inverted output terminal Q. which outputs inverted data. The D-FF 95 is a circuit which detects the data Si at a positive edge of the VCO output signal So and stores the detected data. The delay circuit 96 comprises a data input terminal D which inputs data Si, an inverted data input terminal D/ which inputs the inverted data Si/, a data output terminal Q and an inverted data output terminal Q/. The delay circuit 96 is a circuit which delays the data Si and the inverted data Si/ by 90° compared to the data Si so as to be outputted therefrom.

A transfer gate 97 is connected to the output terminal Q of the D-FF 95, and a second transfer gate 98 is connected to the inverted output terminal Q/. A third transfer gate 99 is connected to the output terminal Q, and a fourth transfer gate 100 is connected to the inverted output terminal Q/. The first transfer gate 97 is a circuit comprised by a parallel circuit including an NMOS and a PMOS, so that the gate 97 transmits an output signal outputted from the output terminal Q of the D-FF 95 when the data Si is at "H" level. The second transfer gate 98 is a circuit comprised of a parallel circuit including an NMOS and a PMOS, so that the gate 98 transmits an inverted output signal outputted from the inverted output terminal Q/ of the D-FF 95 when the data Si is at "L" level. The third transfer gate 99 is a circuit comprised of a parallel circuit including an NMOS and a PMOS, so that the gate 99 transmits an output signal outputted from the output terminal Q of the delay circuit 96 when the data Si is at "H" level. The fourth transfer gate 100 is a circuit comprised of a parallel circuit including an NMOS and a PMOS, so that the gate 100 transmits an inverted output signal outputted from the inverted output terminal Q/ of the delay circuit 96 when the data Si is at "L" level.

A first inverter 101 is connected to the output sides of the first and second transfer gates, and a second inverter 102 is connected to the output sides of the third and fourth transfer gates 99 and 100. The first inverter 101 is a circuit which inputs the output signals of both the first and second transfer gates 97 and 98 and outputs a first output signal S103 to an output terminal 103. The second inverter 102 is a circuit which inputs the output signals of both the third and fourth transfer gates 99 and 100 and outputs a second output signal S104 to an output terminal 104.

Next, the operation of the phase comparator shown in FIG. 11 will be described.

A unit formed by the first and second transfer gates 97 and 98 and the first inverter 101 corresponds to the EXOR gate 45 shown in FIG. 5. The unit outputs the "H"-level first output signal S103 when only one of the output signals of the data Si and the D-FF 95 is at "H" level. Similarly, a unit formed by the third and fourth transfer gates 99 and 100 and the second inverter 102 corresponds to the EXOR gate 46 shown in FIG. 5. The unit outputs the "L"-level second output signal S104 when only one of the output signals of the data Si and the delay circuit is at "H" level. In this manner, the phase comparator in FIG. 11 operates in a similar manner to that of FIG. 5.

Since the direction of the signals is in a single direction compared to the above first embodiment, there is no need to take into account the difference of the delay time of the signals generated for each logic element. Thus, in contrast to the phase comparator according to the first embodiment, the phase comparator according to this fourth embodiment is suitable for high-speed operation.

Modifications

The present invention is not limited to the above embodiments and various modifications are possible. The various modifications include the following four cases (a) through (d).

(a) The D-FF 43 in FIG. 5 and the D-FF 95 in FIG. 11 may be replaced with other types of flip-flops. Moreover, although delay circuits 44 and 96 are described where the amount of the phase delay is set to 90°, this amount may be, for example, 80°, 100° or any angle between 0° and 180°. The same advantageous operation and effects are achieved with any angle used in that range.

(b) The EXOR gates 45, 46 and 73 shown in FIG. 5 and FIG. 8 may be replaced with EXCNOR gates. If the EXOR gate 73 in FIG. 8 is replaced with an EXNOR gate, then the AND gates 74 and 75 may be replaced with NOR gates, thereby achieving the same advantageous effects realized in the above embodiments.

(c) In the third embodiment shown in FIG. 10, the first logic circuit is comprised of the two-stage inverters 83-1 and 83-2, the second logic circuit comprised of the two-stage inverters 83-3 and 83-4, the third logic circuit comprised of the two-stage inverters 83-5 and 83-6, and the fourth logic circuit comprised of the two-stage inverter 83-7 and 83-8. However, the respective logic gates may be replaced with a single stage inverter or three-stage inverters. Moreover, the two NMOS's 84 and 85 may be other switching element(s) such as a PMOS or the like. When the two NMOS's are replaced with other switching elements, the same advantageous operation and effects may be obtained if, for example, the ground potential is replaced with another constant potential corresponding to the other switching element.

(d) In the fourth embodiment shown in FIG. 11, the transfer gates 97–100 may be other transistors or the like.

In summary, the phase comparator is comprised of the flip-flop, delay circuit, and first and second logic gates, so that, for example, when the phase comparator is provided in the PLL circuit or the like for use in extracting a clock signal that identifies and regenerates the non-return-to-zero receiving signal, the jitter of the clock signal can be eliminated. Thus, high-speed response for the comparator and high accuracy in the identified phase can be achieved.

Moreover, according to another embodiment, the phase comparator comprises the flip-flop, the delay circuit, the first to fourth transfer gates, and the first and second inverters. In the dual structure in which the input data and its inverted data are simultaneously inputted, the same advantageous effects are obtained. Since the direction of the signal flow is in a single direction, the difference of the signal's delay time generated in each logic element need not be taken into account, thus realizing high speed operation.

Moreover, according to still another embodiment, at the output side of the comparator there is provided the converter comprised of the third logic gate and the first and second output circuits. Thus, for example, when the comparator is provided in a PLL circuit or the like, a pulse proportional to the phase of the input data and the phase of the VCO output signal can be generated, so that a problem due to the charge pump provided at the input side of the loop filter can be eliminated.

Moreover, according to still another embodiment, at the output side of comparator there is provided the converter comprised of first to fourth logic circuits and the first and second switching elements, so that the same advantageous effects as in the above embodiment are obtained. Moreover, since the signal flow is in a single direction, as compared to the above embodiment, there is no need to take into account the difference of the signal's delay time generated in each logic element, thus achieving a desirable high-speed operation.

What is claimed is:

1. A phase comparator, comprising:
   a flip-flop circuit which receives input data and a clock signal as input, and stores the input data in response to the clock signal;
   a delay circuit which receives the input data and delays said input data by a predetermined angle of 0° through 180°, a data input of said flip-flop circuit being connected to a data input of said delay circuit;
   a first logic gate which receives the input data and an output signal of said flip-flop circuit and which outputs a first output signal by taking an exclusive OR or exclusive NOR of the input data and the flip-flop output signal;
   a second logic gate which inputs the input data and the output signal of said delay circuit and which outputs a second output signal by taking an exclusive OR or exclusive NOR of the input data and the delay circuit output signal; and
   a converter comprising
   (a) a third logic gate which inputs the first output signal and the second output signal, and takes an exclusive OR or exclusive NOR of the two output signals;
   (b) a first output circuit which inputs the first output signal and an output signal of said third logic gate, and detects whether or not said two signals match, so as to output a phase-delay signal in the event that said two signals match; and
   (c) a second output circuit which outputs the second output signal and an output signal of sail third logic gate, and detects whether or not said two signals match, so as to output a phase-forward signal in the event that said two signals match.

2. The phase comparator of claim 1, wherein each output circuit includes a logic gate which performs an AND or NAND of data applied at the data input terminals of that output circuit, and provides the first output signal and an output signal of said third logic gate, and said second output circuit includes a logic gate which performs an AND or NAND of the second output signal and an output signal of said third logic gate.

3. A phase comparator, comprising:
   a flip-flop circuit which inputs data and a clock signal, and stores the input data in response to the clock signal;
   a delay circuit which inputs the input data and delays said input data by a predetermined angle of 0° through 180°, a data input of said flip-flop circuit being connected to a data input of said delay circuit;
   a first logic gate which inputs the input data and an output signal of said flip-flop circuit and which outputs a first output signal by taking an exclusive OR or exclusive NOR of the input data and the flip-flop output signal;
   a second logic gate which inputs the data and the output signal of said delay circuit and which outputs a second output signal by taking an exclusive OR or exclusive NOR of the input data and the delay circuit output signal; and
   a converter comprising:
   (a) a first logic circuit, which inverts the first output signal or inverts the inverted first output signal;
   (b) a second logic circuit, which inverts an output signal of said first logic circuit or inverts said inverted first output signal so that a phase-delay signal is produced;
   (c) a third logic circuit which inverts the second output signal or inverts the inverted second output signal;
   (d) a fourth logic circuit which inverts an output signal of said third logic circuit so that a phase-forward signal is produced;
   (e) a first switching element which is switched by the first output signal so as to set the output signal of said third logic circuit to a constant potential; and
   (f) a second switching element which is switched by the second output signal so as to set the first output signal to a constant potential.

4. A phase comparator of claim 3, further comprising a charge pump connected to an output side of said converter, including:
   an inverter connected to one of said output circuits;
   a first p-channel type MOSFET having a gate connected to said inverter a drain connected to a first n-channel type MOSFET and a source connected to a first current mirror circuit;
   said first current mirror circuit connected to the source of the first p-channel type MOSFET and the power supply potential;
   a first constant-current source connected to the power supply potential via said first current mirror circuit;
   said first n-channel type MOSFET having a gate connected to other output circuit, a drain connected to the drain of said first p-channel type MOSFET and a source connected to a second current mirror circuit;
   said second current mirror circuit connected to the source of said first n-channel type MOSFET and connected to the ground;

a second constant-current source connected to ground via said second current mirror circuit; and an output terminal provided between the drain of said first p-channel type MOSFET and the drain of said first n-channel type MOSFET.

5. The phase comparator of claim 4, wherein said first current mirror circuit includes:

a second p-channel type MOSFET and a third p-channel type MOSFET, each having a gate connected to one another; and a second n-channel type MOSFET and a third n-channel type MOSFET, each having a gate connected to one another.

6. A phase comparator of claim 3, further comprising a charge pump connected to an output side of said converter, including:

an inverter connected to one of said output circuits;

a first p-channel type MOSFET having a gate connected to said inverter, a drain connected to a first n-channel type MOSFET, and a source connected to a first current mirror circuit;

said first current mirror circuit connected to the source of the first p-channel type MOSFET and the power supply potential;

a first constant-current source connected to the power supply potential via said first current mirror circuit;

said first n-channel type MOSFET having a gate connected to other output circuit, a drain connected to the drain of said first p-channel type MOSFET and a source connected to a second current mirror circuit;

said second current mirror circuit connected to the source of said second n-channel type MOSFET and connected to the ground;

a second constant-current source connected to ground via said second current mirror circuit; and an output terminal provided between the drain of the first p-channel type MOSFET and the drain of the first n-channel type MOSFET.

7. A phase comparator of claim 6, wherein said first current mirror circuit includes:

a second p-channel type MOSFET and a third p-channel type MOSFET, each having a gate connected to one another; and a second n-channel type MOSFET and a third n-channel type MOSFET, each having a gate connected to one another.

8. A phase comparator, comprising:

a flip-flop circuit which inputs input data, inverted data thereof and a clock signal, and which stores the input data and the inverted data in response to the clock signal;

a delay circuit which inputs the input data and the inverted data, and which delays the input data and the inverted data by a predetermined angle of 0° through 180°;

a first transfer gate which inputs the input data, the inverted data and an output signal of said flip-flop circuit, and which transmits the output signal of said flip-flop circuit when the input data are at a logic "H" level;

a second transfer gate which inputs the input data, the inverted data and an inverted output signal of said flip-flop circuit, and which transmits the inverted output signal of said flip-flop circuit when the input data are at a logic "L" level;

a first logic inversion circuit which inputs output signals of said first and second transfer gates, and which outputs a first output signal by inverting a summed-up value of two outputs of said first and second transfer gates;

a third transfer gate which inputs the input data, inverted data and an output signal of said delay circuit, and which transmits the output signal of said delay circuit when the input data are at a logic "H" level;

a fourth transfer gate which inputs the input data, the inverted data and an inverted output signal of said delay circuit, and which transmits the inverted output signal of said delay circuit when the input data are at a logic "L" level; and a second logic inversion circuit which inputs output signals of said third and fourth transfer gates, and which outputs a second output signal by inverting a summed-up value of the two outputs of said third and fourth transfer gates.

9. The phase comparator of claim 8, further comprising a converter connected to an output side of said phase comparator, including:

a third logic gate which inputs the first output signal and the second output signals, and takes exclusive OR or exclusive NOR thereof;

a first output circuit which inputs the first output signal and an output signal of said third logic gate, and detects whether or not said two signals match, so as to output a phase-delay signal in the event that said two signals match; and a second output circuit which outputs the second output signal and an output signal of said third logic gate, and detects whether or not said two signals match, so as to output a phase-forward signal in the event that said two signals match.

10. A comparator of claim 9, further comprising a charge pump connected to an output side of said converter, including:

an inverter connected to one of said output circuits;

a first p-channel type MOSFET having a gate connected to said inverter, a drain connected to a first n-channel type MOSFET and a source connected to a power supply potential;

a first current mirror circuit connected to the source of the first p-channel type MOSFET and the power supply potential;

a first constant-current source connected to the power supply potential via said first current mirror circuit;

said first n-channel type MOSFET having a gate connected to other output circuit, a drain connected to the drain of said first p-channel type MOSFET and a source connected to ground;

a second current mirror circuit connected to the source of said first n-channel type MOSFET and connected to the ground;

a second constant-current source connected to the power supply potential via said second current mirror circuit; and an output terminal provided between the drain of said first p-channel type MOSFET and the drain of said first n-channel type MOSFET.

11. The phase comparator of claim 8, wherein each output circuit includes a logic gate which performs an AND or NAND of data applied at the data input terminals of that output circuit, and provides the first output signal and an output signal of said third logic gate, and said second output circuit includes a logic gate which performs an AND or NAND of the second output signal and an output signal of said third logic gate.

12. The phase comparator of claim 8, further comprising a converter including:
   a first logic circuit which inverts the first output signal or inverts the inverted first output signal;
   a second logic circuit which inverts an output signal of said first logic circuit or inverts said inverted signal so that a phase-delay signal is produced;
   a third logic circuit which inverts the second output signal or inverts the inverted second output signal;
   a fourth logic circuit which inverts an output signal of said third logic circuit so that a phase-forward signal is produced;
   a first switching element which switches by the first output signal so as to set an output signal of said third logic circuit to a constant potential; and
   a second switching element which switches by the second output signal so as to set the first output signal to a constant potential.

13. A phase comparator of claim 12, further comprising a charge pump connected to an output side of said converter, including:
   an inverter connected to one of said output circuits;
   a first p-channel type MOSFET having a gate connected to said inverter, a drain connected to a first n-channel type MOSFET and a source connected to a power supply potential;
   a first current mirror circuit connected to the source of the first p-channel type MOSFET and the power supply potential;
   a first constant-current source connected to the power supply potential via said first current mirror circuit;
   said first n-channel type MOSFET having a gate connected to other output circuit, a drain connected to the drain of said first p-channel type MOSFET and a source connected to ground;
   a second current mirror circuit connected to the source of said first n-channel type MOSFET and connected to the ground;
   a second constant-current source connected to the power supply potential via said second current mirror circuit; and
   an output terminal provided between the drain of said first p-channel type MOSFET and the drain of said first n-channel type MOSFET.

14. A phase locked loop circuit comprising:
   a phase comparator including:
      a flip-flop circuit which inputs data and a clock signal, and stores the input data in response to the clock signal;
      a delay circuit which inputs the input data and delays the input data by a predetermined angle of 0°–180°, a data input of said flip-flop circuit being connected to a data input of said delay circuit;
      a first logic gate which inputs the input data and an output signal of the flip-flop circuit, and which outputs a first output signal by taking an exclusive OR or exclusive NOR thereof;
      a second logic gate which inputs the data and an output signal of said delay circuit and which outputs a second output signal by taking an exclusive OR or exclusive NOR of the two signals;
      a converter, connected to said first logic gate and said second logic gate, which generates pulses proportional to a phase of the input data and a phase of a voltage controlled oscillator, wherein said converter includes:
         (a) a third logic gate which inputs the first output signal and the second output signal, and takes exclusive OR or exclusive NOR of the two signals;
         (b) a first output circuit which inputs the first output signal and an output signal of said third logic gate, and detects whether or not said two signals match, so as to output a phase-delay signal in the event that said two signals match; and
         (c) a second output circuit which outputs the second output signal and the output signal of said third logic gate, and detects whether or not said two signal match, so as to output a phase-forward signal in the event that said two signals match;
   a charge pump circuit, connected to an output side of said converter, which calculates a time average of pulses outputted from said phase converter; and
   a loop filter, comprised of a resistor and a capacitor and connected to an output side of said charge pump circuit, and which smoothes the output voltage and extracts a control voltage proportional to the phase difference; wherein
      said voltage controlled oscillator controls an oscillation frequency by the control voltage, and an output signal of said voltage controlled oscillator is fed back to said phase comparator so as to serve as the clock signal.

15. A phase locked loop circuit comprising:
   a phase comparator including:
      a flip-flop circuit which receives input data and a clock signal as inputs, and stores the input data in response to the clock signal;
      delay circuit which inputs the input data and delays the input data by a predetermined angle of 0°–180°, a data input of said flip-flop circuit being connected to a data input of said delay circuit;
      a first logic gate which inputs the input data and an output signal of the flip-flop circuit and which outputs a first output signal by taking an exclusive OR or exclusive NOR thereof;
      a second logic gate which inputs the input data and an output signal of the delay circuit and which outputs a second output signal by taking an exclusive OR or exclusive NOR of the two signals;
      a converter, connected to said first logic gate and said second logic gate, which generates pulses proportional to a phase of the input data and a phase of a voltage controlled oscillator, wherein said converter includes:
         (a) a first logic circuit, which inverts the first output signal or inverts the inverted first output signal;
         (b) a second logic circuit, which inverts an output signal of said first logic circuit or inverts said inverted signal that a phase-delay signal is produced;
         (c) a third logic circuit which inverts the second output signal or inverts the inverted second output signal;
         (d) a fourth logic circuit which inverts an output signal of said third logic circuit so that a phase-forward signal is produced;
         (e) a first switching element which is switched by the first output signal so as to set the output signal of said third logic circuit to a constant potential; and (f) a second switching element which is switched by the second output signal so as to set the first output signal to a constant potential;

a charge pump circuit, connected to an output side of said converter, which calculates a time average of pulses outputted from said phase converter; and a loop filter, comprised of a resistor and a capacitor and connected to an output side of said charge pump circuit, and which smoothes the output voltage and extracts a control voltage proportional to the phase difference; wherein said voltage controlled oscillator controls an oscillation frequency by the control voltage, and an output signal of said voltage controlled oscillator is fed back to said phase comparator so as to serve as the clock signal.

16. A phase locked loop circuit comprising:

a phase comparator including:

a flip-flop circuit which inputs input data, inverted data thereof and a clock signal, and which stores the input data and the inverted data in response to the clock signal;

a delay circuit which inputs the input data and the inverted data, and which delays the input data and the inverted data by a predetermined angle of 0° through 180°;

a first transfer gate which inputs the input data, the inverted data and an output of said flip-flop circuit, and which transmits an output of said flip-flop circuit when the input data are at a logic "H" level;

a second transfer gate which inputs the input data, the inverted data and an inverted output of said flip-flop circuit, and which transmits the inverted output of said flip-flop circuit when the input data are at a logic "L" level;

a first logic inversion circuit which inputs outputs of said first and second transfer gates, and which outputs a first output signal by inverting a summed-up value of two outputs of said first and second transfer gates;

a third transfer gate which inputs the input data, inverted data and an output signal of said delay circuit, and which transmits the output signal of said delay circuit when the input data are at a logic "H" level;

a fourth transfer gate which inputs the input data, the inverted data and an inverted output signal of said delay circuit, and which transmits the inverted output signal of said delay circuit when the input data is at a logic "L" level; and a second logic inversion circuit which inputs outputs of said third and fourth transfer gates, and which outputs a second output signal by inverting a summed-up value of the two outputs of said third and fourth transfer gates;

a converter, connected to said first logic conversion circuit and said second logic conversion circuit, which generates pulses proportional to the phase of the input data and the phase of a voltage controlled oscillator; and a charge pump circuit, connected to an output side of said converter, which calculates a time average of pulses outputted from said converter;

a loop filter, comprised of a resistor and a capacitor and connected to an output side of said charge pump circuit, and which smoothes out the output voltage and extracts a control voltage proportional to the phase difference; and said voltage controlled oscillator which controls an oscillation frequency by the control voltage, whereby an output signal of said voltage controlled oscillator is fed back to said phase comparator so as to serve as the clock signal.

17. The phase locked loop circuit of claim 16, wherein said converter includes:

a third logic gate which inputs the first output signal and the second output signals, and takes exclusive OR or exclusive NOR of the two signals;

a first output: circuit which inputs the first output signal and an output signal of said third logic gate, and detects whether or not said two signals match, so as to output a phase-delay signal in the event that said two signals match; and a second output circuit which outputs the second output signal and an output signal of said third logic gate, and detects whether or not said two signals match, so as to output a phase-forward signal in the event that said two signals match.

18. The phase locked loop circuit of claim 16, wherein said converter includes:

a first logic circuit, which inverts the first output signal or inverts the inverted first output signal;

a second logic circuit, which inverts an output signal of said first logic circuit or inverts said inverted signal so that a phase-delay signal is produced;

a third logic circuit which inverts the second output signal or inverts the inverted second output signal;

a fourth logic circuit which inverts an output signal of said third logic circuit so that a phase-forward signal is produced;

a first switching element which is switched by the first output signal so as to set an output signal of said third logic circuit to a constant potential; and a second switching element which is switched by the second output signal so as to set the first output signal to a constant potential.

19. A phase comparator comprising a flip-flop circuit which receives input data and a clock signal as input, and stores the input data in response to the clock signal;

a delay circuit which inputs the input data and delays said input data by a predetermined angle of 90°, a data input of said flip-flop circuit being connected to a data input of said delay circuit;

a first logic gate which inputs the input data and an output signal of said flip-flop circuit and which outputs a first output signal by taking an exclusive OR or exclusive NOR of the input data and the flip-flop output signal;

a second logic gate which inputs the data and the output signal of said delay circuit and which outputs a second output signal by taking an exclusive OR or exclusive NOR of the input data and the delay circuit output signal; and a converter, including:

a third logic gate which inputs the first output signal and the second output signal, and takes an exclusive OR or exclusive NOR of the two signals;

a first output circuit which inputs the first output signal and an output signal of said third logic gate, and detects whether or not said two signals match, so as to output a phase-delay signal in the event that said two signals match; and a second output circuit which outputs the second output signal and an output signal of said third logic gate, and detects whether or not said two signals match, so as to output a phase-forward signal in the event that said two signals match.

20. The phase comparator of claim 19, wherein:
each output circuit comprises a logic gate which performs an AND or NAND of data applied at the data input terminals of that output circuit, and provides the first output signal and an output signal of said third logic gate; and
said second output circuit includes a logic gate which performs an AND or NAND of the second output signal and an output signal of said third logic gate.

21. A phase comparator comprising a flip-flop circuit which receives input data and a clock signal as input, and stores the input data in response to the clock signal;
a delay circuit which inputs the input data and delays said input data by a predetermined angle of 90°, a data input of said flip-flop circuit being connected to a data input of said delay circuit;
a first logic gate which inputs the input data and an output signal of said flip-flop circuit and which outputs a first output signal by taking an exclusive OR or exclusive NOR of the input data and the flip-flop output signal;
a second logic gate which inputs the data and the output signal of said delay circuit and which outputs a second output signal by taking an exclusive OR or exclusive NOR of the input data and the delay circuit output signal; and
a converter, including:
a first logic circuit, which inverts the first output signal or inverts the inverted first output signal;
a second logic circuit, which inverts an output signal of said first logic circuit or inverts said inverted signal so that a phase-delay signal is produced;
a third logic circuit which inverts the second output signal or inverts the inverted second output signal;
a fourth logic circuit which inverts an output signal of said third logic circuit so that a phase-forward signal is produced;
a first switching element which is switched by the first output signal so as to set an output signal of said third logic circuit to a constant potential; and
a second switching element which is switched by the second output signal so as to set the first output signal to a constant potential.

22. A phase comparator of claim 21, further comprising a charge pump connected to an output side of said converter, including:
an inverter connected to one of said output circuits;
a first p-channel type MOSFET having a gate connected to said inverter, a drain connected to a first n-channel type MOSFET and a source connected to a first current mirror circuit;
said first current mirror circuit connected to the source of the first p-channel type MOSFET and the power supply potential;
a first constant-current source connected to the power supply potential via said first current mirror circuit;
said first n-channel type MOSFET having a gate connected to other output circuit, a drain connected to the drain of said first p-channel type MOSFET and a source connected to a second current mirror circuit;
said second current mirror circuit connected to the source of said first n-channel type MOSFET and connected to the ground;
a second constant-current source connected to ground via said second current mirror circuit; and
an output terminal provided between the drain of said first p-channel type MOSFET and the drain of said first n-channel type MOSFET.

23. The phase comparator of claim 22, wherein said first current mirror circuit includes:
a second p-channel type MOSFET and a third p-channel type MOSFET, each having a gate connected to one another; and
a second n-channel type MOSFET and a third n-channel type MOSFET, each having a gate connected to one another.

24. A phase comparator of claim 21, further comprising a charge pump connected to an output side of said converter, including:
an inverter connected to one of said output circuits;
a first p-channel type MOSFET having a gate connected to said inverter, a drain connected to a first n-channel type MOSFET, and a source connected to a first current mirror circuit;
said first current minor circuit connected to the source of the first p-channel type MOSFET and the power supply potential;
a first constant-current source connected to the power supply potential via said first current mirror circuit;
said first n-channel type MOSFET having a gate connected to other output circuit, a drain connected to the drain of said first p-channel type MOSFET and a source connected to a second current mirror circuit;
said second current mirror circuit connected to the source of said second n-channel type MOSFET and connected to the ground;
a second constant-current source connected to ground via said second current mirror circuit; and
an output terminal provided between the drain of the first p-channel type MOSFET and the drain of the first n-channel type MOSFET.

25. A phase comparator of claim 24, wherein said first current mirror circuit includes:
a second p-channel type MOSFET and a third p-channel type MOSFET, each having a gate connected to one another; and
a second n-channel type MOSFET and a third n-channel type MOSFET, each having a gate connected to one another.

26. A phase locked loop circuit comprising:
a phase comparator including:
a flip-flop circuit which inputs input data and a clock signal and stores the input data in response to the clock sign 1;
a delay circuit which inputs the input data and delays the input data by a predetermined angle of 90°, a data input f said flip-flop circuit being connected to a data input of said delay circuit;
a first logic gate which inputs the input data and an output signal of the flip-flop circuit and which outputs a first output signal by taking an exclusive OR or exclusive NOR thereof;
a second logic gate which inputs the input data and an output signal of the delay circuit and which outputs a second output signal by taking an exclusive OR or exclusive NOR of the two signals;
a converter, connected to said first logic gate and said second logic gate, which generates pulses proportional to a phase of the input data and a phase of a voltage controlled oscillator;

a charge pump circuit, connected to an output side of said converter, which calculates a time average of pulses outputted from said phase converter; and a loop filter, comprised of a resistor and a capacitor and connected to an output side of said charge pump circuit, and which smoothes an output voltage of the charge pump circuit and extracts a control voltage proportional to the phase difference; wherein said voltage controlled oscillator controls an oscillation frequency by the control voltage, and an output signal of said voltage controlled oscillator is fed back to said phase comparator so as to serve as the clock signal;

wherein said converter includes:

a third logic gate which inputs the first output signal and the second output signals, and takes exclusive OR or exclusive NOR of the two signals;

a first output circuit which inputs the first output signal and an output signal of said third logic gate, and detects whether or not said two signals match, so as to output a phase-delay signal in the event that said two signals match; and a second output circuit which outputs the second output signal and an output signal of said third logic gate, and detects whether or not said two signals match, so as to output a phase-forward signal in the event that said two signals match.

27. A phase locked loop circuit comprising:

a phase comparator including:

a flip-flop circuit which inputs input data and a clock signal and stores the input data in response to the clock signal;

a delay circuit which inputs the input data and delays the input data by a predetermined angle of 90°, a data input of said flip-flop circuit being connected to a data input of said delay circuit;

a first logic gate which inputs the input data and an output signal of the flip-flop circuit and which outputs a first output signal by taking an exclusive OR or exclusive NOR thereof;

a second logic gate which inputs the input data and an output signal of the delay circuit and which outputs a second output signal by taking an exclusive OR or exclusive NOR of the two signals;

a converter, connected to said first logic gate and said second logic gate, which generates pulses proportional to a phase of the input data and a phase of a voltage controlled oscillator;

a charge pump circuit, connected to an output side of said converter, which calculates a time average of pulses outputted from said phase converter; and a loop filter, comprised of a resistor and a capacitor and connected to an output side of said charge pump circuit, and which smoothes an output voltage of the charge pump circuit and extracts a control voltage proportional to the phase difference; wherein said voltage controlled oscillator controls an oscillation frequency by the control voltage, and an output signal of said voltage controlled oscillator is fed back to said phase comparator so as to serve as the clock signal;

wherein said converter includes:

a first logic circuit, which inverts the first output signal or inverts the inverted first output signal;

a second logic circuit, which inverts an output signal of said first logic circuit or inverts said inverted signals that a phase-delay signal is produced;

a third logic circuit which inverts the second output signal or inverts the inverted second output signal;

a fourth logic circuit which inverts an output signal of said third logic circuit so that a phase-forward signal is produced;

a first switching element which is switched by the first output signal so as to set an output signal of said third logic circuit to a constant potential; and a second switching element which is switched by the second output signal so as to set the first output signal to a constant potential.

* * * * *